(12) United States Patent
Shin et al.

(10) Patent No.: US 8,716,040 B2
(45) Date of Patent: May 6, 2014

(54) ORGANIC LIGHT EMITTING DIODE DISPLAY AND METHOD FOR MANUFACTURING THE SAME

(75) Inventors: Min-Chul Shin, Yongin (KR); Jong-Moo Huh, Yongin (KR); Bong-Ju Kim, Yongin (KR); Yun-Gyu Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 152 days.

(21) Appl. No.: 13/113,279

(22) Filed: May 23, 2011

(65) Prior Publication Data

US 2011/0297951 A1 Dec. 8, 2011

(30) Foreign Application Priority Data

Jun. 4, 2010 (KR) ........................ 10-2010-0052864

(51) Int. Cl.
*H01L 21/00* (2006.01)
(52) U.S. Cl.
USPC .............................................. 438/22; 438/34
(58) Field of Classification Search
USPC ..................................................... 438/22, 34
See application file for complete search history.

(56) References Cited

U.S. PATENT DOCUMENTS

2009/0278131 A1 11/2009 Kwon et al.

FOREIGN PATENT DOCUMENTS

| CN | 101577283 | 11/2009 |
|---|---|---|
| JP | 2009-271527 | 11/2009 |
| JP | 2009-277733 | 11/2009 |
| KR | 10-2005-0113413 | 12/2005 |
| KR | 10-2008-0047935 | 5/2008 |

*Primary Examiner* — Douglas Menz
(74) *Attorney, Agent, or Firm* — H.C. Park & Associates, PLC

(57) ABSTRACT

An organic light emitting diode (OLED) display and a manufacturing method thereof, the OLED display includes: a substrate main body; a polycrystalline silicon layer pattern including a polycrystalline active layer formed on the substrate main body and a first capacitor electrode; a gate insulating layer pattern formed on the polycrystalline silicon layer pattern; a first conductive layer pattern including a gate electrode and a second capacitor electrode that are formed on the gate insulating layer pattern; an interlayer insulating layer pattern formed on the first conductive layer pattern; and a second conductive layer pattern including a source electrode, a drain electrode and a pixel electrode that are formed on the interlayer insulating layer pattern. The gate insulating layer pattern is patterned at a same time with any one of the polycrystalline silicon layer pattern and the first conductive layer pattern.

13 Claims, 21 Drawing Sheets

ORGANIC LIGHT EMITTING DIODE DISPLAY AND METHOD FOR MANUFACTURING THE SAME

CROSS-REFERENCE TO RELATED APPLICATION

This application claims the benefit of Korean Patent Application No. 10-2010-0052864, filed Jun. 4, 2010, in the Korean Intellectual Property Office, the disclosure of which is incorporated herein by reference.

BACKGROUND

1. Field

Aspects of the present invention relate generally to an organic light emitting diode (OLED) display and a manufacturing method thereof. More particularly, the described technology relates generally to an organic light emitting diode (OLED) display and a manufacturing method thereof, in which a structure and a manufacturing process thereof are simplified.

2. Description of the Related Art

An organic light emitting diode (OLED) display is a self-light emitting display device that displays an image by using an organic light emitting diode that emits light. Light is generated by energy generated when an exciton falls from an exited state. The exciton is generated by combining electrons and holes in an organic emission layer. The organic light emitting diode (OLED) display displays an image using the generated light.

In general, the organic light emitting diode (OLED) display is manufactured through several photolithography processes by using eight or more masks. However, as the organic light emitting diode (OLED) display gradually becomes large and the number of masks increases, there is a problem in that a productivity of manufacturing may deteriorate.

The above information disclosed in this Background section is only for enhancement of understanding of the background of the described technology and therefore it may contain information that does not form the prior art that is already known in this country to a person of ordinary skill in the art.

SUMMARY

Aspects of the present invention provide an organic light emitting diode (OLED) display that has a simple structure so that the number of photolithography process used in a manufacturing process is reduced. In addition, aspects of the present invention provide a method of manufacturing the OLED display.

According to aspects of the present invention, an OLED display includes: a substrate main body; a polycrystalline silicon layer pattern including a polycrystalline active layer formed on the substrate main body and a first capacitor electrode; a gate insulating layer pattern formed on the polycrystalline silicon layer pattern; a first conductive layer pattern including a gate electrode and a second capacitor electrode that are formed on the gate insulating layer pattern; an interlayer insulating layer pattern formed on the first conductive layer pattern; and a second conductive layer pattern including a source electrode, a drain electrode and a pixel electrode that are formed on the interlayer insulating layer pattern. The gate insulating layer pattern may be identically patterned at a same time with any one of the polycrystalline silicon layer pattern and the first conductive layer pattern.

According to another aspect of the present invention, the gate insulating layer pattern has a plurality of contact holes exposing a portion of the polycrystalline silicon layer pattern, and wherein the gate insulating pattern may be formed in a same pattern as the polycrystalline silicon layer pattern.

According to another aspect of the present invention, the first conductive layer pattern may include a first metal layer, and wherein the second conductive layer pattern may include a transparent conductive layer and a second metal layer formed on an area of a portion of the transparent conductive layer.

According to another aspect of the present invention, the interlayer insulating layer pattern may has contact holes exposing a portion of the first conductive layer pattern and contact holes exposing a portion of the polycrystalline silicon layer pattern in conjunction with the gate insulating layer pattern.

According to another aspect of the present invention, the gate insulating layer pattern may be formed with a same pattern as the first conductive layer pattern.

According to another aspect of the present invention, the first conductive layer pattern may include a doped amorphous silicon layer and the first metal layer, wherein the first metal layer is formed on the doped amorphous silicon layer, and wherein the second conductive layer pattern may include the transparent conductive layer and the second metal layer that is formed on an area of a portion of the transparent conductive layer.

According to another aspect of the present invention, the interlayer insulating layer pattern may has contact holes exposing a portion of the first conductive layer pattern, and wherein the interlayer insulating layer pattern has opening regions exposing a portion of the polycrystalline silicon layer pattern in conjunction with the gate insulating layer pattern.

According to another aspect of the present invention, the OLED display may further include a pixel definition film having an opening exposing a portion of the pixel electrode, the pixel definition film being formed on the second conductive layer pattern; an organic emission layer formed on the pixel electrode; and a common electrode formed on the organic emission layer.

According to another aspect of the present invention, the source electrode and the drain electrode may include the transparent conductive layer and the second metal layer, and the pixel electrode may include the transparent conductive layer.

According to another aspect of the present invention, the source electrode, the drain electrode and the pixel electrode may each include the transparent conductive layer.

According to another aspect of the present invention, the first conductive layer pattern may further include a data line and a common power line.

According to another aspect of the present invention, the second conductive layer pattern may further include a gate line and a connection line.

According to another aspect of the present invention, the interlayer insulating layer may include the first interlayer insulating layer and the second interlayer insulating layer, and wherein a refractive index of the second interlayer insulating layer is different from a refractive index of the first interlayer insulating layer.

According to another aspect of the present invention, the interlayer insulating layer may include at least one of various inorganic films and organic films.

According to aspects of the present invention, there is provided a method of manufacturing an organic light emitting diode (OLED) display includes: preparing a substrate main body; sequentially layering a polycrystalline silicon layer, a gate insulating layer and a first metal layer on the substrate main body; forming a polycrystalline silicon layer pattern, a gate insulating layer pattern and a first conductive layer pattern by patterning the polycrystalline silicon layer, the gate insulating layer and the first metal layer; forming an interlayer insulating layer pattern on the first conductive layer pattern; and forming a second conductive layer pattern on the interlayer insulating layer pattern. The polycrystalline silicon layer pattern may include the polycrystalline active layer and the first capacitor electrode, wherein the gate insulating layer pattern has a plurality of contact holes exposing a portion of the polycrystalline silicon layer pattern and is formed in a same pattern as the polycrystalline silicon layer pattern, and wherein the first conductive layer pattern includes the gate electrode and the second capacitor electrode that are formed on the gate insulating layer pattern.

According to another aspect of the present invention, the polycrystalline silicon layer pattern, the gate insulating layer pattern and the first conductive layer pattern may be formed together through a photolithography process using a double exposure or halftone exposure process.

According to another aspect of the present invention, the interlayer insulating layer pattern may have contact holes exposing a portion of the first conductive layer pattern and wherein the interlayer insulating layer pattern has contact holes exposing a portion of the polycrystalline silicon layer pattern in conjunction with the gate insulating layer pattern.

According to another aspect of the present invention, the source electrode and the drain electrode may be each connected to an area of the portion of the polycrystalline active layer that is exposed through the interlayer insulating layer pattern and the gate insulating layer pattern.

According to another aspect of the present invention, the first conductive layer pattern include a data line and a common power line.

According to another aspect of the present invention, the forming of the second conductive layer pattern may include sequentially layering the transparent conductive layer and the second metal layer on the interlayer insulating layer; forming the source electrode and drain electrode including the transparent conductive layer and the second metal layer; and forming the pixel electrode including the transparent conductive layer by patterning the transparent conductive layer and the second metal layer together.

According to another aspect of the present invention, the method of manufacturing the OLED display may include doping an n-type or p-type impurity on an area of a portion of the polycrystalline silicon layer before forming the second conductive layer pattern.

According to another aspect of the present invention, the forming of the second conductive layer pattern may include sequentially layering the transparent conductive layer and the second metal layer on the interlayer insulating layer, and forming the source electrode and drain electrode and the pixel electrode that include the transparent conductive layer by patterning the transparent conductive layer and the second metal layer together.

According to another aspect of the present invention, the method of manufacturing the OLED display may include doping an n-type or p-type impurity on an area of a portion of the polycrystalline silicon layer after forming the second conductive layer pattern.

According to another aspect of the present invention, the method of manufacturing the OLED display may further include forming the pixel definition film having an opening exposing a portion of the pixel electrode on the second conductive layer pattern, forming an organic emission layer on the pixel electrode, and forming a common electrode on the organic emission layer.

According to another aspect of the present invention, the second conductive layer pattern may further include a gate line and a connection line.

According to another aspect of the present invention, the interlayer insulating layer pattern may include the first interlayer insulating layer and the second interlayer insulating layer, wherein a refractive index of the second interlayer insulating layer is different than a refractive index of the first interlayer insulating layer.

According to another aspect of the present invention, the interlayer insulating layer pattern may include at least one of various inorganic films and organic films.

According to aspects of the present invention, there is provided a method of manufacturing an organic light emitting diode (OLED) display includes: preparing a substrate main body; sequentially layering a polycrystalline silicon layer, a gate insulating layer, a doped amorphous silicon layer and a first metal layer on the substrate main body; forming the polycrystalline silicon layer pattern that includes the polycrystalline active layer and the first capacitor electrode; forming a gate insulating layer intermediate that is formed on the polycrystalline silicon layer pattern; forming a first conductive layer intermediate formed on the gate insulating layer intermediate by patterning the polycrystalline silicon layer, the gate insulating layer, the doped amorphous silicon layer and the first metal layer together; forming an interlayer insulating layer on the first conductive layer intermediate; forming a first conductive layer pattern and an interlayer insulating layer pattern exposing a portion of the gate insulating layer intermediate by patterning the first conductive layer intermediate and the interlayer insulating layer; forming a gate insulating layer pattern exposing a portion of the polycrystalline active layer by etching the gate insulating layer intermediate exposed through the first conductive layer pattern and the interlayer insulating layer pattern; and forming a second conductive layer pattern on the polycrystalline active layer and the interlayer insulating layer pattern.

According to another aspect of the present invention, the first conductive layer pattern may include a gate electrode and a second capacitor electrode, wherein the first conductive layer pattern may be formed of the doped amorphous silicon layer and the first metal layer.

According to another aspect of the present invention, the first conductive layer pattern may further include a data line and a common power line.

According to another aspect of the present invention, the interlayer insulating layer pattern may have contact holes exposing a portion of the first conductive layer pattern and opening regions exposing a portion of the polycrystalline silicon layer pattern in conjunction with the gate insulating layer pattern.

According to another aspect of the present invention, the source electrode and the drain electrode may be each connected to an area of the portion of the polycrystalline active layer that is exposed through the interlayer insulating layer pattern and the gate insulating layer pattern.

According to another aspect of the present invention, the forming of the second conductive layer pattern may include sequentially layering the transparent conductive layer and the second metal layer on the interlayer insulating layer, and forming a source electrode, a drain electrode and a pixel electrode by patterning the transparent conductive layer and the second metal layer together, wherein the source electrode and the drain electrode include the transparent conductive layer and the second metal layer, and wherein the pixel electrode includes the transparent conductive layer According to another aspect of the present invention, the method of manufacturing the OLED display may include doping an n-type or p-type impurity on an area of a portion of the polycrystalline silicon layer before forming the second conductive layer pattern.

According to another aspect of the present invention, the forming of the second conductive layer pattern may include sequentially layering the transparent conductive layer and the second metal layer on the interlayer insulating layer, and forming a source electrode, a drain electrode and a pixel electrode that all include the transparent conductive layer by patterning the transparent conductive layer and the second metal layer together.

According to another aspect of the present invention, the method of manufacturing the OLED display may include doping an n-type or p-type impurity on an area of a portion of the polycrystalline silicon layer after forming the second conductive layer pattern.

According to another aspect of the present invention, the method of manufacturing the OLED display may further include forming a pixel definition film having an opening exposing a portion of a pixel electrode on the second conductive layer pattern, forming an organic emission layer on the pixel electrode, and forming a common electrode on the organic emission layer.

According to another aspect of the present invention, the second conductive layer pattern may further include a gate line and a connection line.

According to another aspect of the present invention, the interlayer insulating layer may include a first interlayer insulating layer and a second interlayer insulating layer, wherein a refractive index of the second interlayer insulating layer is different from a refractive index of the first interlayer insulating layer.

According to another aspect of the present invention, the interlayer insulating layer may include at least one of various inorganic films and organic films.

According to aspects of the present invention, the OLED display may have a simple structure so that a number of photolithography processes used in the manufacturing process are reduced. In addition, an exemplary embodiment provides a method of manufacturing an organic light emitting diode (OLED) display.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
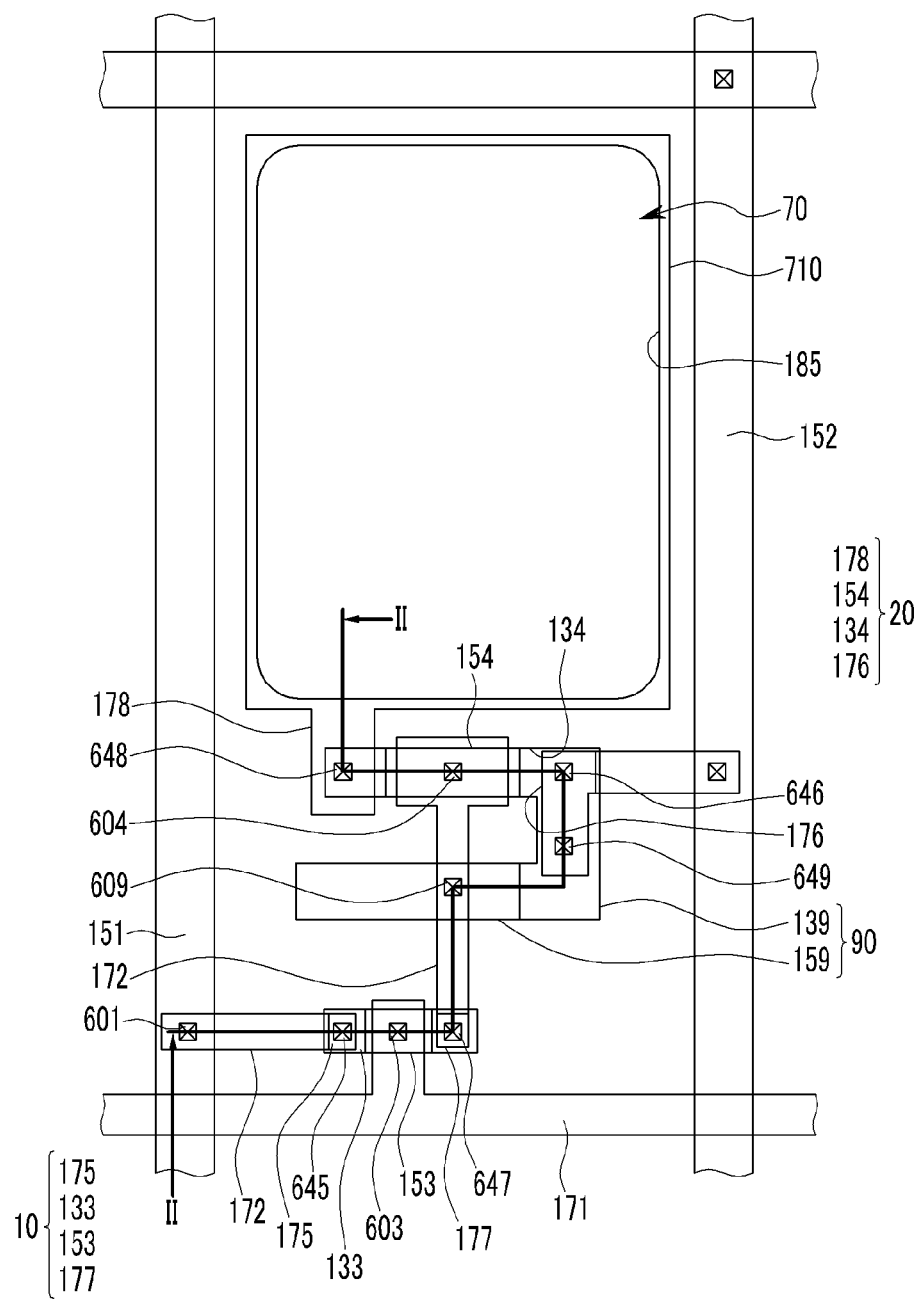
FIG. 1 is a layout view of an organic light emitting diode (OLED) display according to an embodiment.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

As referred to herein, when a first element, item or layer is said to be disposed or formed "on", or "adjacent to", a second element, item or layer, the first element, item or layer can directly contact the second element, item or layer, or can be separated from the second element, item or layer by one or more other elements, items or layers located therebetween. In contrast, when an element, item or layer is referred to as being disposed or formed "directly on" another element, item or layer, there are no intervening elements, items or layers present.

Figure 2:
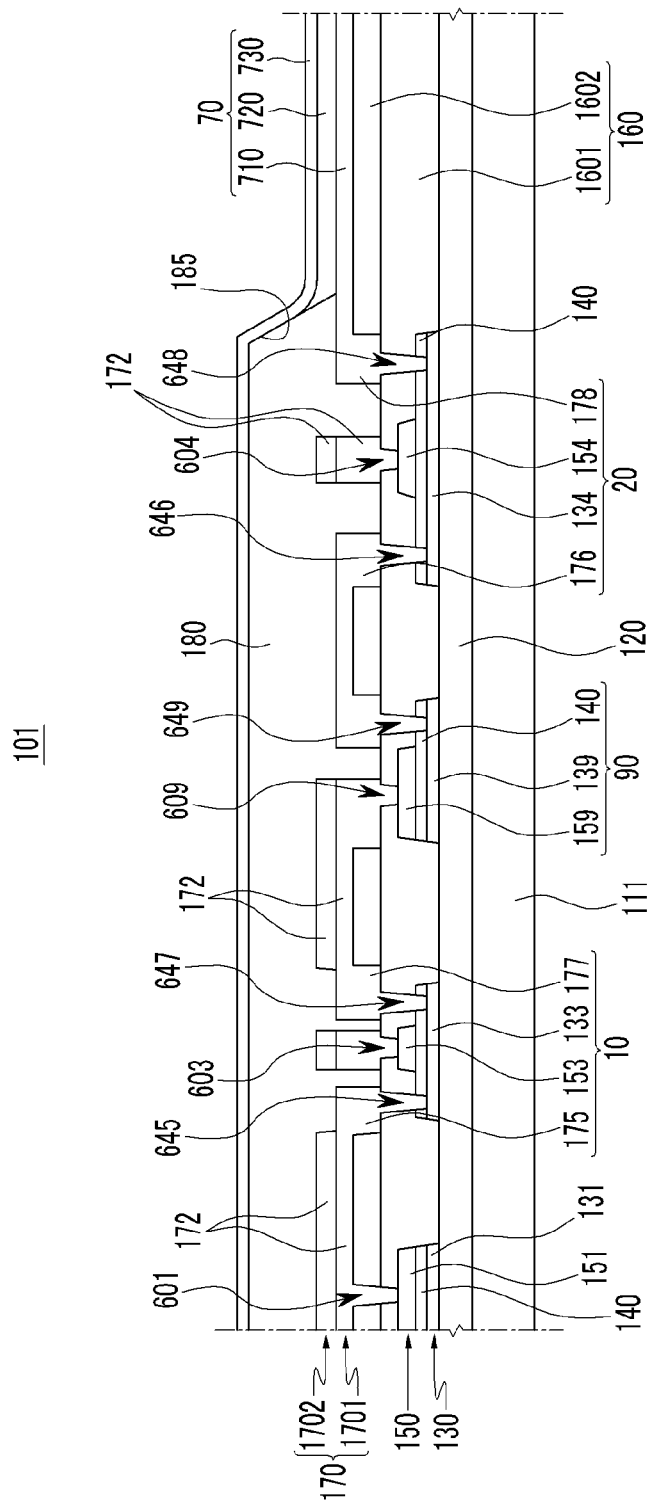
FIG. 2 is a cross-sectional view that is taken along the line II-II of FIG. 1.

Hereinafter, referring to FIG. 1 and FIG. 2, an organic light emitting diode (OLED) display 101, according to an embodiment of the present invention, will be described. As shown in FIG. 1 and FIG. 2, the organic light emitting diode (OLED) display 101 includes thin film transistors 10 and 20, OLED 70 and capacitor 90 that are formed on each pixel on a substrate main body 111. A pixel is a minimum unit with which the OLED display 101 displays an image.

In addition, the OLED display 101 further includes a gate line 171 that is disposed along one direction, a data line 151 that crosses the gate line 171 in an insulation state, and a common power line 152. Here, one pixel may be defined by the gate line 171, the data line 151 and the common power source line 152 as the boundary thereof. However, aspects of the present invention are not limited thereto and a pixel may be defined in other suitable manners.

The OLED 70 includes a pixel electrode 710, an organic emission layer 720 that is formed on the pixel electrode 710, and a common electrode 730 that is formed on the first organic emission layer 720. Holes and electrons are injected into the organic emission layer 720 from the pixel electrode 710 and the common electrode 730. When an exciton, in which the injected holes are cohered with an electron, falls from the exited state to the bottom state, light is emitted.

The capacitor 90 includes a first capacitor electrode 139 and a second capacitor electrode 159 with a gate insulating layer pattern 140 that is disposed therebetween. Here, the gate insulating layer 140 becomes a dielectric material. A capacitance is determined by a charge that is accumulated in the capacitor 90 and the voltage between the first and second capacitor electrodes 139 and 159.

The thin film transistors include the first thin film transistor 10 that acts as a switch and the second thin film transistor 20 that drives the OLED 70. Each of the thin film transistors 10 and 20 includes a gate electrode 153 and 154, source electrode 175 and 176 and drain electrodes 177 and 178. The first thin film transistor 10 selects a pixel that will emit light. The gate electrode 153 of the first thin film transistor 10 is connected to the gate line 171. The source electrode 175 of the first thin film transistor 10 to the data line 151. The drain electrode 177 is connected to any one of the capacitor electrode 159 of the capacitor 90 and the source electrode 157 of the second thin film transistor 20.

The second thin film transistor 20 applies a driving signal the OLED 70 in the selected pixel to the pixel electrode 710. The source electrode 176 of the second thin film transistor 20 and the other capacitor electrode 139 of the capacitor 90 are connected to the common power line 152. The drain electrode 178 of the second thin film transistor 20 is connected to the pixel electrode 710 of the OLED 70.

By the above structure, the first thin film transistor 10 is operated by a gate voltage that is applied to the gate line 171 and transfers the data voltage that is applied to the data line 151 to the second thin film transistor 20. A voltage that corresponds to a difference between the common voltage that is applied from the common power line 152 to the second thin film transistor 20 and the data voltage that is transmitted from the first thin film transistor 10 is stored in the capacitor 90. The current that corresponds to the voltage that is stored in the capacitor 90 is supplied through the second thin film transistor 20 to the organic light emitting diode 70.

Hereinafter, referring to FIG. 2, an OLED display 101, according to the embodiment of FIG. 1, will be described in detail according to a layering order. The substrate main body 111 is formed of a transparent insulating material that is made of glass, quartz, ceramic, plastic, or other similar materials. However, aspects of the present invention are not limited thereto, and the substrate main body 111 may be formed of a metal substrate that is made of stainless steel, or other similar materials. In addition, in the case of when the substrate main body 111 is made of plastic, or other similar materials, it may be formed of a flexible substrate.

A buffer layer 120 is formed on the substrate main body 111, and is formed of various insulation materials, such as silicon nitride SiNx and silicon oxide $SiO_2$, that are known to those of ordinary skill in the art. For example, the buffer layer 120 may be formed in a single film of silicon nitride SiNx or a double film structure in which silicon nitride SiNx and silicon oxide $SiO_2$ are layered. The buffer layer 120 prevents the penetration of impurity elements, foreign materials or unnecessary components, such as moisture or dust, and planarizes a surface. However, aspects of the present invention are not limited thereto and the buffer layer 120 may be used or omitted according to the kind of the substrate main body 111 and process condition.

A polycrystalline silicon layer pattern 130 is formed on the buffer layer 120. The polycrystalline silicon layer pattern 130 includes polycrystalline active layers 133 and 134 and the first capacitor electrode 139. In addition, the polycrystalline silicon layer pattern 130 further includes a dummy polycrystalline layer 131 that is disposed under the data line 151 and common power line 152 (see FIG. 1).

The polycrystalline silicon layer pattern 130 is formed by patterning the polycrystalline silicon layer through a photolithography process. In this case, the polycrystalline silicon layer pattern 130 is patterned through a same photolithography process in conjunction with the gate insulation layer pattern 140 and the first conductive layer pattern 150, as described later. In addition, the polycrystalline silicon layer is formed by using a method to form and crystallize an amorphous silicon layer.

The gate insulating layer pattern 140 is formed using a same pattern as the polycrystalline silicon layer pattern 130 that has a plurality of contact holes 645, 646, 647, 648, and 649 that expose respective portions of the polycrystalline silicon layer pattern 130. That is, in an area in which the polycrystalline silicon layer pattern 130 is not formed, the gate insulating layer pattern 140 is not formed. The gate insulating layer pattern 140 is formed by including one or more of various insulation materials that are known those of ordinary skill in the art, such as tetraethoxysilane (tetra ethyl ortho silicate, TEOS), silicon nitride SiNx and silicon oxide $SiO_2$, or other suitable materials.

A first conductive layer pattern 150 is formed on the gate insulating layer pattern 140. The first conductive layer pattern 150 includes the gate electrodes 153 and 154 and the second capacitor electrode 159. In addition, the first conductive layer pattern 150 further includes the data line 151 and common power line 152 (see FIG. 1). However, aspects of the present invention are not limited thereto and the first conductive layer pattern 150 may further include the gate line 171 instead of the data line 151 and common power line 152.

Figure 3:
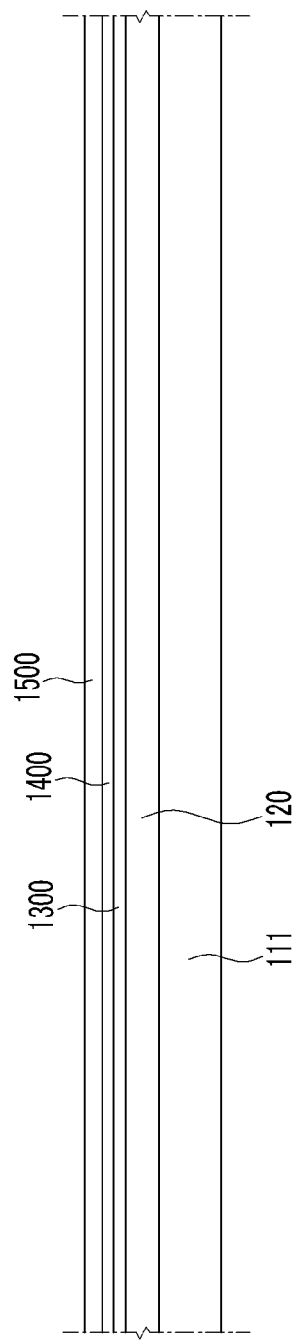
FIG. 3 to FIG. 12 are cross-sectional views and layout views that sequentially illustrate a manufacturing process of the organic light emitting diode (OLED) display that is shown in FIG. 1 and FIG. 2.

The first conductive layer pattern 150 includes a first metal layer 1500 (see FIG. 3). That is, the first conductive layer pattern 150 is formed by patterning the first metal 1500 layer through the above mentioned photolithography process. The first metal layer 1500 is formed by including one or more of various metallic materials, such as molybdenum (Mo), chromium (Cr), aluminum (Al), silver (Ag), titanium (Ti), tantalum (Ta) and tungsten (W), or other suitable metallic materials. The capacitor 90 is formed by the first capacitor electrode 139, the second capacitor electrode 159 and the gate insulating layer pattern 140 disposed between the first capacitor electrode 139 and the second capacitor electrode 159.

An interlayer insulating layer pattern 160 is formed on the first conductive layer pattern 150. The interlayer insulating layer pattern 160 has contact holes 601, 603, 604, and 609 that expose a portion of the gate electrodes 153 and 154, the second capacitor electrode 159, the data line 151 and the common power line 152. In addition, the interlayer insulating layer pattern 160 has the contact holes 645, 646, 647, 648, and 649 that expose a portion of the polycrystalline active layer 133 and 134 and the first capacitor electrode 139 in conjunction with the gate insulating layer pattern 140.

In addition, the interlayer insulating layer pattern 160 includes the first interlayer insulating layer 1601 and the second interlayer insulating layer 1602. The first interlayer insulating layer 1601 and the second interlayer insulating layer 1602 have different refractive indexes. However, aspects of the present invention are not limited thereto and the first interlayer insulating layer 1601 and the second interlayer insulating layer 1602 may have a same refractive index. As described above, the first interlayer insulating layer 1601 and the second interlayer insulating layer 1602 have different refractive indexes and as a result, the OLED display 101 may have a mirror effect by light that is reflected at the interface between the first interlayer insulating layer 1601 and the second interlayer insulating layer 1602. For example, the first interlayer insulating layer 1601 and the second interlayer insulating layer 1602 are formed of silicon nitride that has the relatively high refractive index, and the other is formed of silicon oxide that has the relatively low refractive index. However, aspects of the present invention are not limited thereto and the interlayer insulating layer pattern 160 includes at least one of various inorganic films and organic films.

A second conductive layer pattern 170 is formed on the interlayer insulating layer pattern 160. The second conductive layer pattern 170 includes the source electrodes 175 and 176, the drain electrodes 177 and 178 and the pixel electrode 710. In addition, the second conductive layer pattern 170 includes the gate line 171 (see FIG. 1) and a connection line 172. However, aspects of the present invention are not limited thereto and the second conductive layer pattern 170 may further include the data line 151 and common power line 152 instead of the gate line 171.

The source electrodes 175 and 176 and drain electrodes 177 and 178 are connected through the contact holes 645, 646, 647, and 648 to the polycrystalline active layers 133 and 134. The pixel electrode 710 extends from the drain electrode 178 of the second thin film transistor 20. The connection line 172 connects the gate electrode 154, the second capacitor electrode 159 and the drain electrode 177 to each other through the contact holes 604 and 609. In addition, the connection line 172 connects the source electrode 175 to the data line 151 through the contact hole 601. In addition, the connection line 172 may connect constitutions that are not shown.

The second conductive layer pattern 170 includes the transparent conductive layer 1701 and the second metal layer 1702 that are formed on an area of a portion of the transparent conductive layer 1701. The source electrodes 175 and 176, drain electrodes 177 and 178 and pixel electrode 710 include the transparent conductive layer 1701. Accordingly, the OLED display 101 displays an image by emitting light in a rear side direction, that is, towards the substrate main body 111. In addition, the gate line 171 (see FIG. 1) and connection line 172 are formed of the transparent conductive layer 1701 and the second metal layer 1702. However, aspects of the present invention are not limited thereto, and the source electrodes 175 and 176 and drain electrodes 177 and 178 may be formed of the transparent conductive layer 1701 and the second metal layer 1702.

However, in an area of a portion of the polycrystalline active layers 133 and 134, an order of process of doping an n-type or p-type impurity may be changed according to whether the source electrodes 175 and 176 and drain electrodes 177 and 178 are formed of the transparent conductive layer 1701 or are formed of both the transparent conductive layer 1701 and the second metal layer 1702. For example, if the source electrodes 175 and 176 and drain electrodes 177 and 178 are formed of the transparent conductive layer 1701, after the second conductive layer pattern 170 is formed, the n-type or p-type impurity is doped in an area of a portion of the polycrystalline active layers 133 and 134. On the other hand, if the source electrodes 175 and 176 and drain electrodes 177 and 178 are formed of the transparent conductive layer 1701 and the second metal layer 1702, before the second conductive layer pattern 170 is formed, the n-type or p-type impurity is doped in an area of a portion of the polycrystalline active layers 133 and 134.

The transparent conductive layer 1701 includes one or more of ITO (Indium Tin Oxide), IZO (Indium Zinc Oxide), ZITO (Zinc Indium Tin Oxide), GITO (Gallium Indium Tin Oxide), $In_2O_3$ (Indium Oxide), ZnO (Zinc Oxide), GIZO (Gallium Indium Zinc Oxide), GZO (Gallium Zinc Oxide), FTO (Fluorine Tin Oxide) and AZO (Aluminum-Doped Zinc Oxide), or other suitable materials. The second metal layer 1702, like the first metal layer 1500 (see FIG. 3), is formed of various metallic materials that are known to those of ordinary skill in the art. In addition, the second conductive layer pattern 170 is formed through a photolithography process that includes a double exposure or halftone exposure process. The gate electrodes 153 and 154, polycrystalline active layers 133 and 134, source electrodes 175 and 176 and drain electrodes 177 and 178 become the thin film transistors 10 and 20.

The pixel definition film 180 is formed on the second conductive layer pattern 170. The pixel definition film 180 includes an opening 185 that exposes a portion of the pixel electrode 710. The pixel definition film 180 is formed of various organic or inorganic materials that are known to one of ordinary skill in the art. For example, the pixel definition film 180 may be cured and formed by heat or light after it is patterned by using a photosensitive organic film.

The organic emission layer 720 is formed on the pixel electrode 710, and the common electrode 730 is formed on the organic emission layer 720. The pixel electrode 710, organic emission layer 720 and common electrode 730 are the OLED 70. In addition, a pixel definition film 180 has the pixel electrode 710, the organic emission layer 720 and the common electrode 730 sequentially layered thereon. Also, the pixel definition film 180 includes an opening 185 that becomes a light emitting area of the OLED 70. According to the above configuration, the OLED display 101 may have a simple structure so that a number of photolithography processes that are used in the manufacturing process are minimized.

In detail, a same photolithography process is used to form the polycrystalline silicon layer pattern 130 and the first conduction layer pattern 150. The first polycrystalline silicon layer pattern 130 includes the polycrystalline active layers 133 and 134, the gate insulating layer pattern 140. The first conductive layer pattern 150 includes the gate electrodes 153 and 154. In addition, the drain electrode 178 of the second thin film transistor 20 and the pixel electrode 710 of the organic light emitting diode 70 may be formed through the same photolithography process. Therefore, according to the present exemplary embodiment, the enlarged OLED display 101 may effectively maintain high productivity with respect to manufacturing yield. In addition, the OLED display 101 may obtain a mirror effect through the first interlayer insulating layer 1601 and the second interlayer insulating layer 1602 that have different refractive indexes.

Hereinafter, referring to FIG. 3 to FIG. 12, a method of manufacturing an organic light emitting diode (OLED) display 101 according to the embodiment of FIG. 1 will be described. First, as shown in FIG. 3, the buffer layer 120, a polycrystalline silicon layer 1300, a gate insulating layer 1400 and a first metal layer 1500 are sequentially formed on the substrate main body 111.

The buffer layer 120 may be formed of various insulation materials that are known to one of ordinary skill in the art, such as silicon nitride SiNx and silicon oxide $SiO_2$, or other suitable insulation materials. The polycrystalline silicon layer 1300 is formed by using a method of depositing and crystallizing the amorphous silicon layer on the buffer layer 120. As the method of crystallizing the amorphous silicon layer, various methods that known to those of ordinary skill in the art, such as methods of applying heat or a laser or of using a metal catalyst, or other suitable methods may be used.

Figure 4:
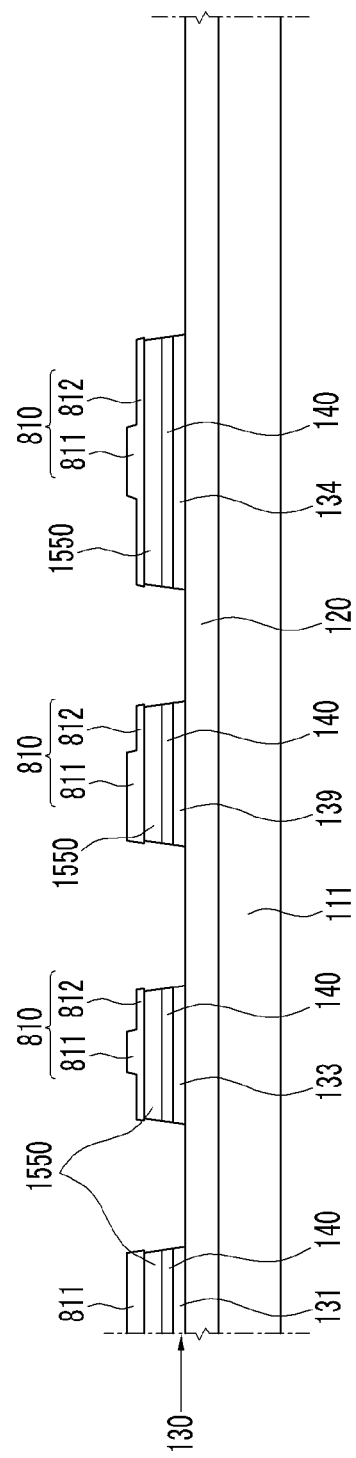

Next, as shown in FIG. 4, a polycrystalline silicon layer pattern 130 and gate insulating layer pattern 140 are formed by etching through a first photosensitive film pattern 810, and thus, a first conductive layer intermediate 1550 is formed. In this case, the first photosensitive film pattern 810 is formed through a double exposure process or halftone exposure process. The first photosensitive film pattern 810 includes a first high thickness portion 811 and a first low thickness portion 812.

Figure 5:
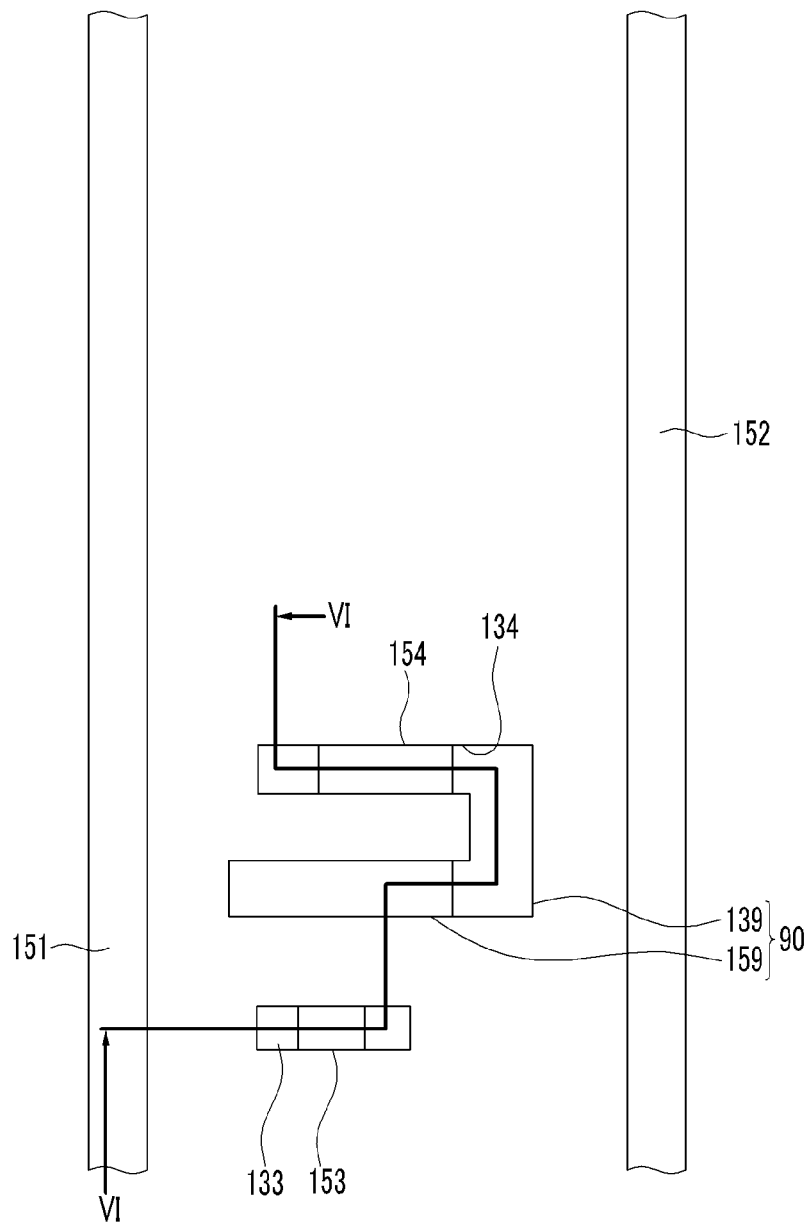
Figure 6:
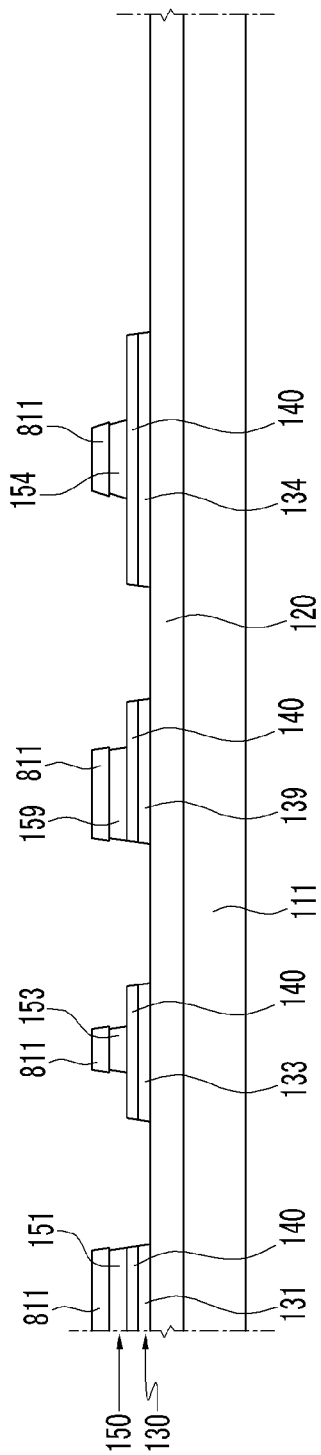

Next, in FIG. 5 and FIG. 6, the first low thickness portion 812 of the first photosensitive film pattern 810 is shown to be removed, or in other words, there is no first low thickness portion 812 in embodiments shown in FIGS. 5 and 6. In this case, a thickness of the first high thickness portion 811 may be lowered slightly. In addition, the first conductive layer pattern 150 is formed by etching the first conductive layer intermediate 1550 through the first high thickness portion 811.

As described above, through a single photolithography process, the polycrystalline silicon layer pattern 130, gate insulating layer pattern 140 and the first conductive layer pattern 150 are formed. The polycrystalline silicon layer pattern 130 includes a polycrystalline active layers 133 and 134 and the first capacitor electrode 139. The gate insulating layer pattern 140 is formed in a same pattern as the polycrystalline silicon layer pattern 130. The first conductive layer pattern 150 includes the gate electrodes 153 and 154, the second capacitor electrode 159, the data line 151 and the common power line 152 (see FIG. 1). In addition, the polycrystalline silicon layer pattern 130 further includes a dummy polycrystalline layer 131. The dummy polycrystalline layer 131 is disposed under the data line 151 of the first conductive layer pattern 150 and the common power line 152. The dummy polycrystalline layer 131 is also formed in the process of manufacturing the OLED display 101 according to the embodiment of FIG. 1.

Figure 7:
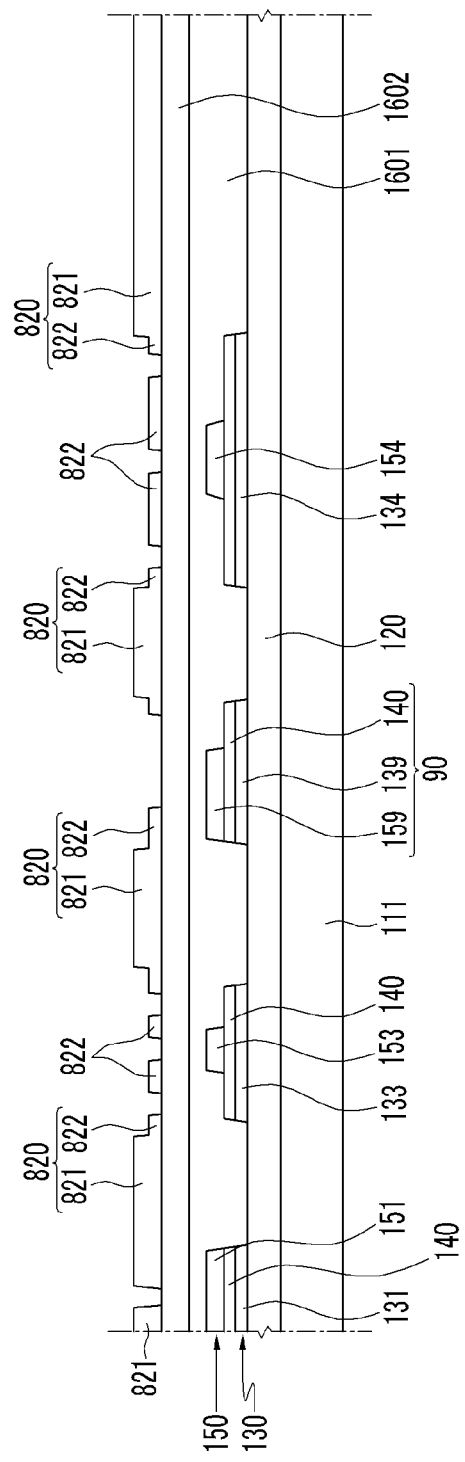

As shown in FIG. 7, a first interlayer insulating layer 1601 and a second interlayer insulating layer 1602 are sequentially formed on the first conductive layer pattern 150. Although not required in all aspects of the present invention, the first interlayer insulating layer 1601 and the second interlayer insulating layer 1602 may have different refractive indexes. For example, one of the first interlayer insulating layer 1601 and the second interlayer insulating layer 1602 is formed of silicon nitride that has the relatively high refractive index, and an other is formed of silicon oxide that has the relatively low refractive index. A second photosensitive film pattern 820 is disposed on the second interlayer insulating layer and includes a second high thickness portion 821 and a second low thickness portion 822.

Figure 8:
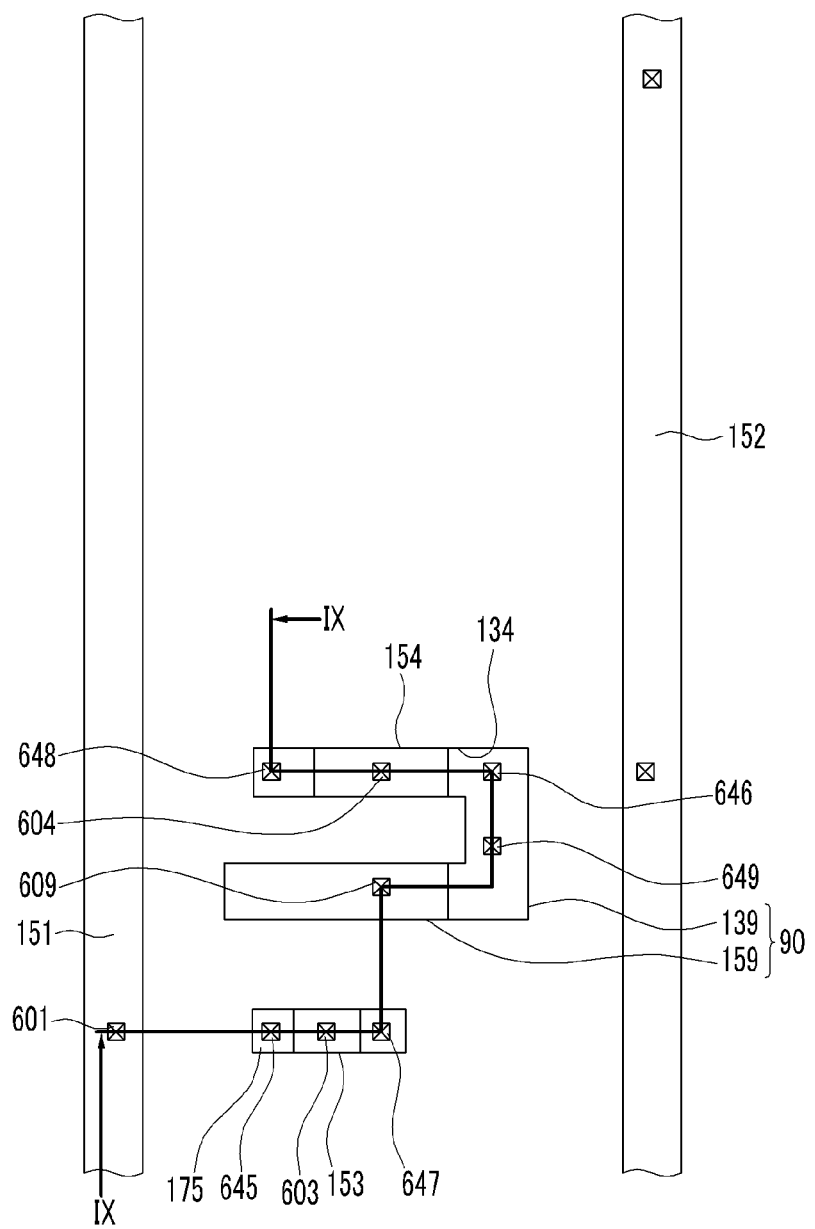
Figure 9:
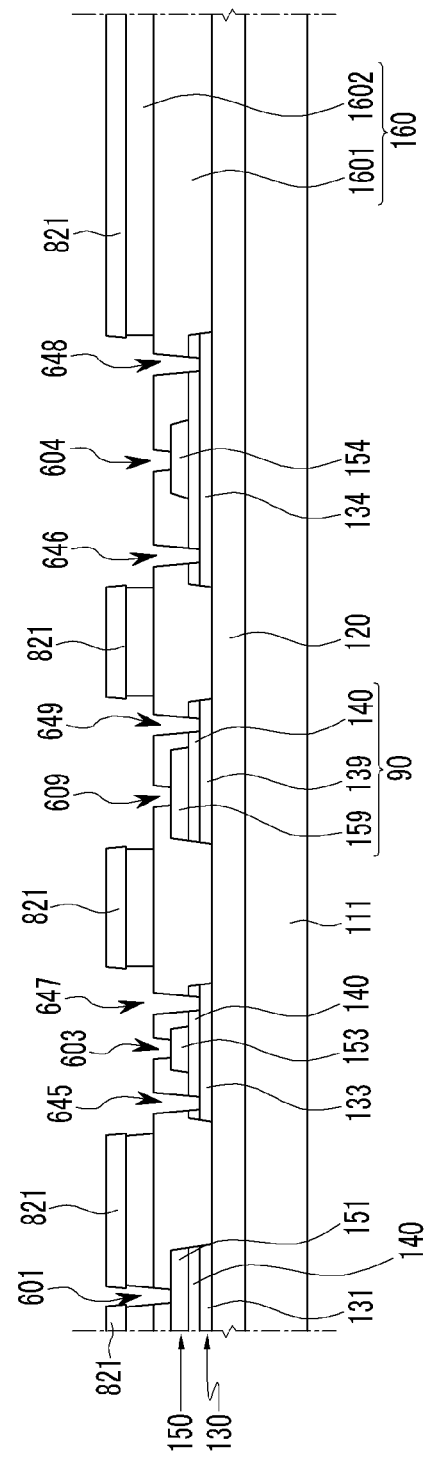

Next, as shown in FIG. 8 and FIG. 9, an interlayer insulating layer pattern 160 is formed by patterning the first interlayer insulating layer 1601 and the second interlayer insulating layer 1602 through a photolithography process using the second photosensitive film pattern 820. The interlayer insulating layer pattern 160 has contact holes 601, 603, 604, and 609 that expose a portion of the gate electrodes 153 and 154, the second capacitor electrode 159, data line 151 and common power line 152. In addition, the interlayer insulating layer pattern 160 has contact holes 645, 646, 647, 648, and 649 that expose a portion of the polycrystalline active layers 133 and 134 and the first capacitor electrode 139 in conjunction with the gate insulating layer pattern 140. In addition, the second interlayer insulating layer 1602 may have the larger etched area than the first interlayer insulating layer 1601 through the second photosensitive film pattern 820 that has the second high thickness portion 821 and the second low thickness portion 822.

Figure 10:
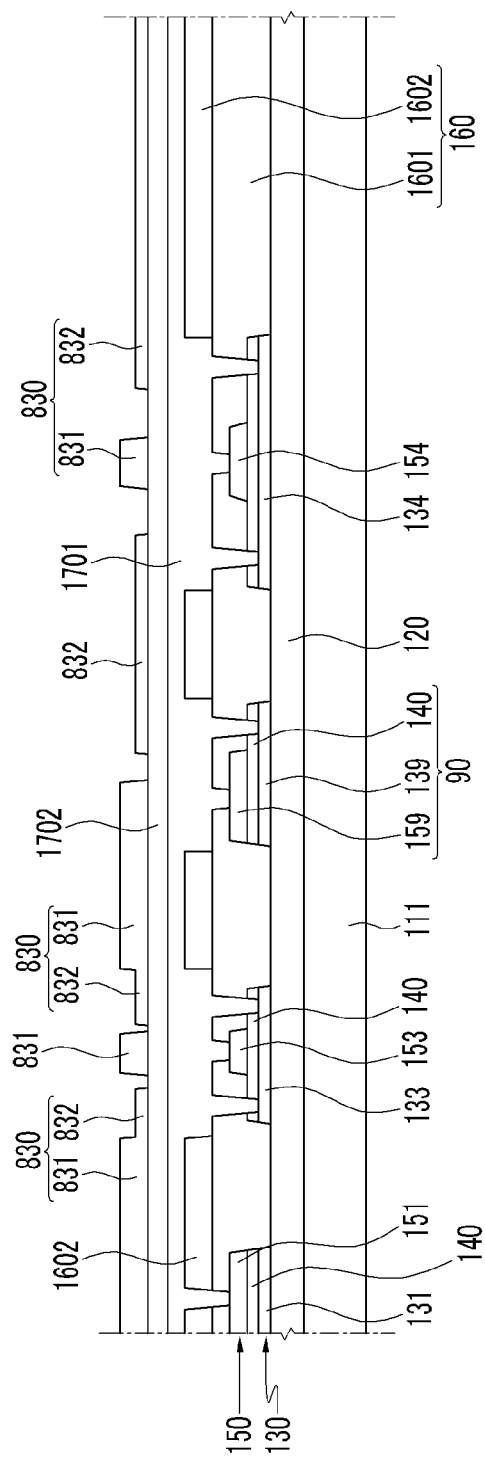

Next, as shown in FIG. 10, a transparent conductive layer 1701 and a second metal layer 1702 are sequentially layered on the interlayer insulating layer pattern 160. The transparent conductive layer 1701 is connected through the contact holes 601, 603, 604, 609, 645, 646, 647, 648, and 649 of the interlayer insulating layer pattern 160 (see FIG. 9) to the gate electrodes 153 and 154, the first capacitor electrode 139, the second capacitor electrode 159, data line 151, common power line 152 and polycrystalline active layers 133 and 134.

In addition, a third photosensitive film pattern 830 is formed on the second metal layer 1702. The third photosensitive film pattern 830 includes a third high thickness portion 831 and a third low thickness portion 832. In this case, the third low thickness portion 832 corresponds to a position in which the source electrodes 175 and 176, drain electrodes 177 and 178 and pixel electrode 710 will be formed.

Figure 11:
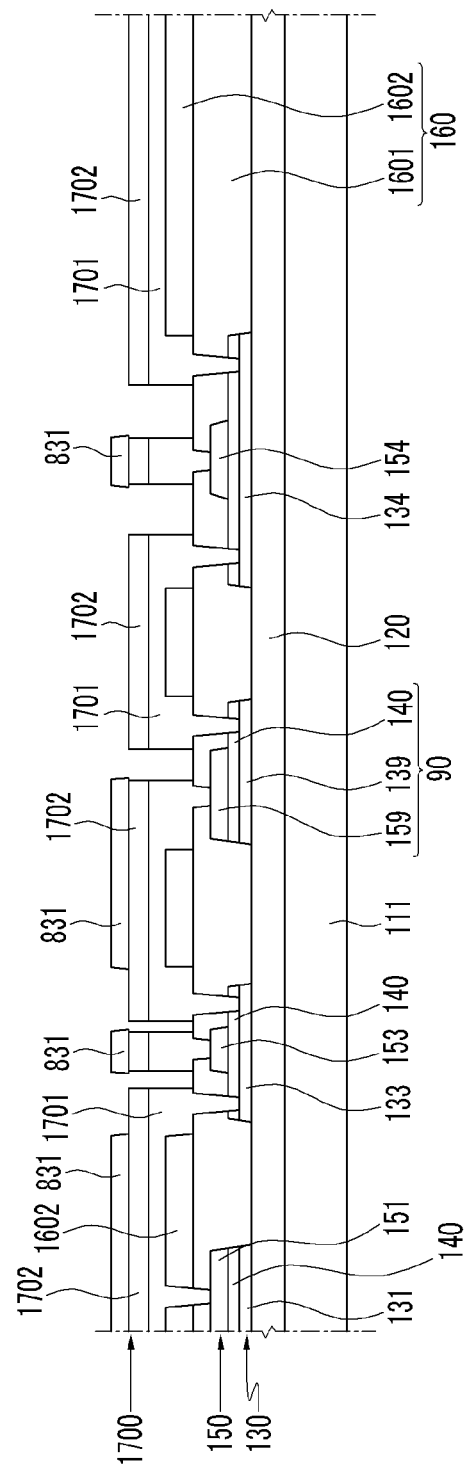

Next, as shown in FIG. 11, by etching through the third photosensitive film pattern 830, a second conductive layer pattern intermediate pattern 1700 that is formed of the transparent conductive layer 1701 and the second metal layer 1702 is formed. Thereafter, the third low thickness portion 832 is removed, and the second conductive layer pattern intermediate 1700 is etched again through the third high thickness portion 831 to form the second conductive layer pattern 170 (see FIG. 12). The second conductive layer pattern 170, the gate line 171 and connection line 172 are formed of the transparent conductive layer 1701 and the second metal layer 1702. The source electrodes 175 and 176, the drain electrodes 177 and 178 and the pixel electrode 710 are formed of the transparent conductive layer 1701.

Next, an n-type or p-type impurity is doped in an area of a portion of the polycrystalline active layers 133 and 134. In the area of the portion of the polycrystalline active layers 133 and 134, the second metal layer 1702 is removed and the transparent conductive layer 1701 is formed. Thus, the n-type or p-type impurity is doped in the area of the portion of the polycrystalline active layer 133 and 134 through the source electrodes 175 and 176 and drain electrodes 177 and 178. On the other hand, the gate electrodes 153 and 154 prevent the n-type or p-type impurity from being doped in the polycrystalline active layers 133 and 134 in an area other than the area of the portion of the polycrystalline active layers 133 and 134 that are doped with the n-type or p-type impurity. Therefore, the polycrystalline active layers 133 and 134 are an intrinsic semiconductor area that is disposed under the gate electrodes 153 and 154 and an impurity semiconductor area that is disposed under the source electrodes 175 and 176 and drain electrodes 177 and 178.

However, aspects of the present invention are not limited to the process described above. That is, a process of doping the n-type or p-type impurity in the area of the portion of the polycrystalline active layers 133 and 134 may be performed before the second conductive layer pattern 170 is formed. In this case, the source electrodes 175 and 176 and drain electrodes 177 and 178 are formed of the transparent conductive layer 1701 and the second metal layer 1702.

Figure 12:
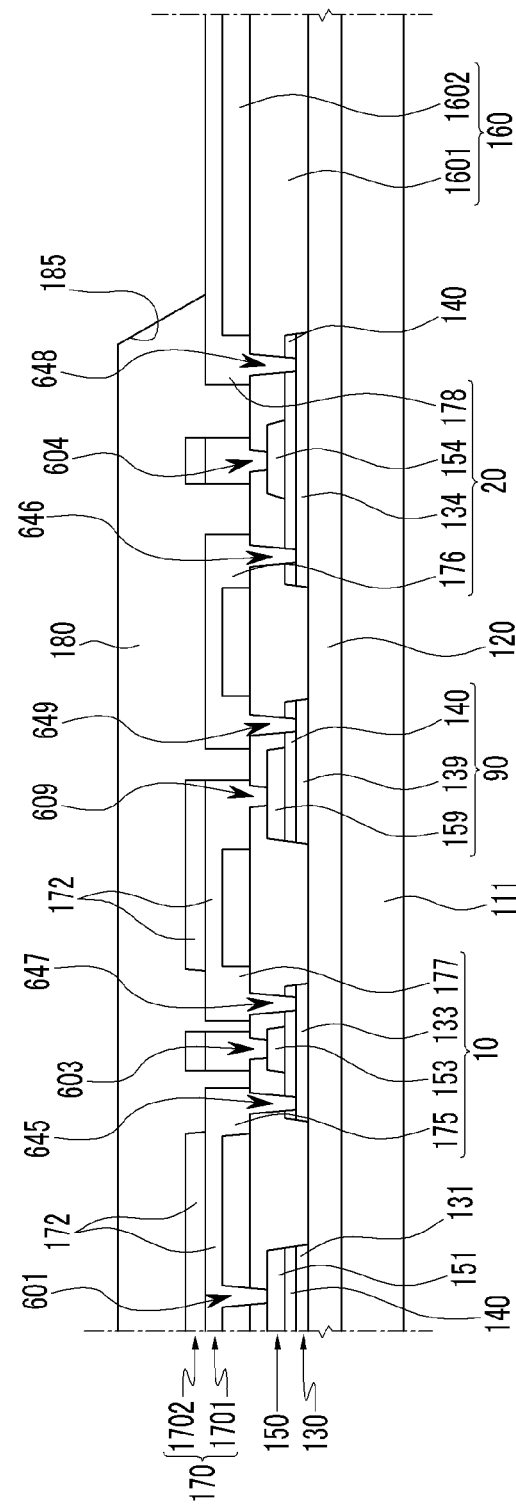

As shown in FIG. 12, the pixel definition film 180 is formed on the second conductive layer pattern 170. The pixel definition film 180 includes an opening 185 that exposes a portion of the pixel electrode 710. In addition, the organic emission layer 720 and common electrode 730 are sequentially layered on the pixel electrode 710.

Through the method of manufacturing the OLED display 101 described above, the OLED display 101, according to the embodiment of FIG. 1, may be manufactured. That is, by minimizing a number of photolithography processes, the OLED display 101 may be manufactured. Therefore, according to the embodiment of FIG. 1, the enlarged OLED display 101 may effectively maintain the high productivity with respect to a manufacturing yield. In addition, although not required in all aspects of the present invention, the OLED display 101 may obtain a mirror effect through the first interlayer insulating layer 1601 and the second interlayer insulating layer 1602 having different refractive indexes.

Figure 13:
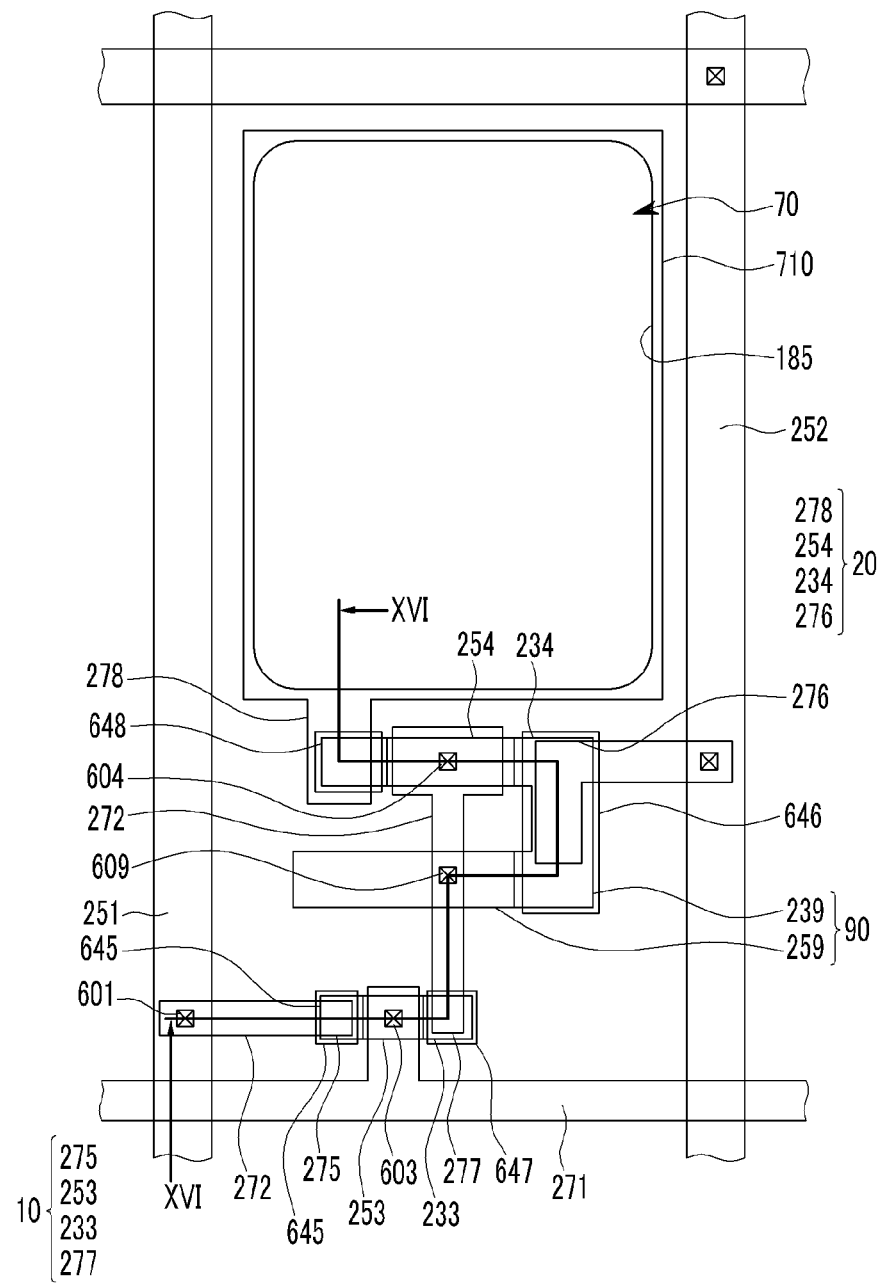
FIG. 13 is a layout view of an organic light emitting diode (OLED) display according to another embodiment.
Figure 14:
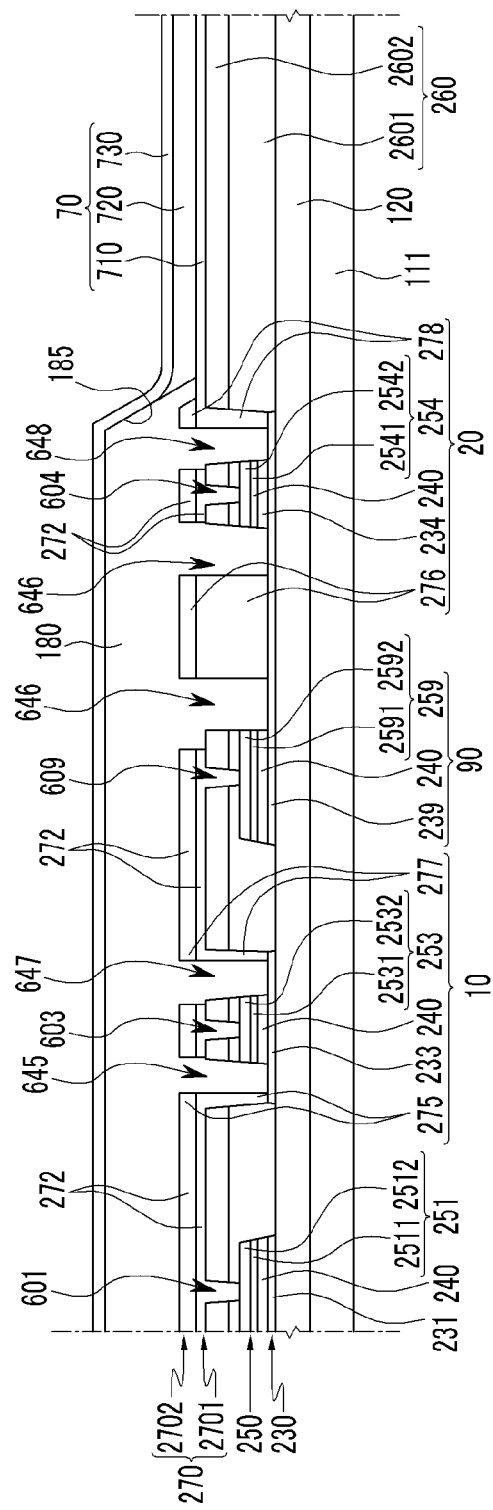
FIG. 14 is a cross-sectional view that is taken along the line XIV-XIV of FIG. 1.

Hereinafter, referring to FIG. 13 and FIG. 14, an organic light emitting diode (OLED) display 102, according to another embodiment, will be described. As shown in FIG. 13 and FIG. 14, a polycrystalline silicon layer pattern 230 is formed on the buffer layer 120. The polycrystalline silicon layer pattern 230 includes polycrystalline active layers 233 and 234 and a first capacitor electrode 239. In addition, the polycrystalline silicon layer pattern 230 further includes a dummy polycrystalline layer 231 that is disposed under the data line 251 and common power line 252.

A gate insulating layer pattern 240 is formed in an area of a portion of the polycrystalline silicon layer pattern 230. That is, in the present embodiment, the gate insulating layer pattern 240 is not formed in a same pattern as the polycrystalline silicon layer pattern 230. Rather, the gate insulating pattern 240 is formed in a same pattern as the first conductive layer pattern 250 that will be described below.

The first conductive layer pattern 250 is formed using a same pattern as the gate insulating layer pattern 240 and is formed on the gate insulating layer pattern 240. The first conductive layer pattern 250 includes gate electrodes 253 and 254 and a second capacitor electrode 259. In addition, the first conductive layer pattern 250 further includes a data line 251 and a common power line 252 (see FIG. 13). However, aspects of the present invention are not limited thereto, and the first conductive layer pattern 250 may further include a gate line 271 (see FIG. 13) instead of the data line 251 and the common power line 252.

The first conductive layer pattern 250 is formed of doped amorphous silicon layers 2511, 2531, 2541, and 2591 and first metal layers 2512, 2532, 2542, and 2592. The doped amorphous silicon layers 2511, 2531, 2541, and 2591 compensate for when the first metal layers 2512, 2532, 2542, and 2592 are damaged or short-circuited in a course of forming the second conductive layer pattern 270.

An interlayer insulating layer pattern 260 is formed on the first conductive layer pattern 250. The interlayer insulating layer pattern 260 has contact holes 601, 603, 604, and 609 that expose a portion of the gate electrodes 253 and 254, the second capacitor electrode 259, the data line 251 and the common power line 252. In addition, the interlayer insulating layer pattern 260 has contact holes 645, 646, 647, and 648 that expose a portion of the polycrystalline active layers 233 and 234 and the first capacitor electrode 239 in conjunction with the gate insulating layer pattern 240.

In addition, the interlayer insulating layer pattern 260 includes a first interlayer insulating layer 2601 and a second interlayer insulating layer 2602. Although not required in all aspects of the present invention, the first interlayer insulating layer 2601 and the second interlayer insulating layer 2602 may have different refractive indexes. As described above, the first interlayer insulating layer 2601 and the second interlayer insulating layer 2602 have different refractive indexes. Thus, the OLED display 102 may have a mirror effect corresponding to light that is reflected at an interface between the first interlayer insulating layer 2601 and the second interlayer insulating layer 2602.

A second conductive layer pattern 270 is formed on the interlayer insulating layer pattern 260. The second conductive layer pattern 270 is formed on a portion of the polycrystalline silicon layer pattern 230 that is exposed through a region of the contact hole 646 of the interlayer insulating layer pattern 260. The second conductive layer pattern 270 includes source electrodes 275 and 276, drain electrodes 277 and 278 and pixel electrode 710. In addition, the second conductive layer pattern 270 further includes the gate line 271 (see FIG. 13) and a connection line 272. However, aspects of the present invention are not limited thereto, and the second conductive layer pattern 270 may further include the data line 251 and common power line 252 instead of the gate line 271.

The source electrodes 275 and 276 and drain electrodes 277 and 278 are connected to the polycrystalline active layers 233 and 234 through the contact holes 645, 646, 647, 648. The pixel electrode 710 extends from the drain electrode 278 of the second thin film transistor 20. Meanwhile, as shown in FIG. 14, the source electrode 276 of the second thin film transistor 20 is formed on the polycrystalline silicon layer pattern 230, however, aspects of the present invention are not limited thereto.

The connection line 272 connects the gate electrode 254 and the second capacitor electrode 259 of the second thin film transistor 20 and the drain electrode 277 of the first thin film transistor 10 through the contact holes 604 and 609. In addition, the connection line 272 connects the source electrode 275 and the data line 251 of the first thin film transistor 10 through the contact hole 601. Furthermore, although not required in all aspects of the present invention, the connection line 272 may connect constitutions or other items and elements that are not shown.

The second conductive layer pattern 270 includes a transparent conductive layer 2701 and a second metal layer 2702 formed on an area of a portion of the transparent conductive layer 2701. The source electrodes 275 and 276, drain electrodes 277 and 278, the gate line 271 and the connection line 272 are formed of the transparent conductive layer 2701 and the second metal layer 2702. In addition, the pixel electrode 710 is formed of the transparent conductive layer 2701. Accordingly, the OLED display 102 is able to display an image by emitting light towards a rear side direction, that is, towards the substrate main body 111. However, aspects of the present invention are not limited thereto, and the source electrodes 275 and 276 and drain electrodes 277 and 278 may be formed of only the transparent conductive layer 2701.

However, according to whether the source electrodes 275 and 276 and drain electrodes 277 and 278 are formed of only the transparent conductive layer 2701 or are formed of the transparent conductive layer 2701 and the second metal layer 2702, in the area of the portion of the polycrystalline active layers 233 and 234, an order of processes to dope an n-type or p-type impurity may be changed. For example, in a case of the source electrodes 275 and 276 and drain electrodes 277 and 278 being formed of the transparent conductive layer 2701 and the second metal layer 2702, before the second conductive layer pattern 270 is formed, the n-type or p-type impurity is doped in the area of the portion of the polycrystalline active layer 230. On the other hand, in the case of the source electrodes 275 and 276 and drain electrodes 277 and 278 being formed of only the transparent conductive layer 2701, after the second conductive layer pattern 270 is formed, the n-type or p-type impurity is doped in the area of the portion of the polycrystalline active layers 233 and 234.

The pixel definition film 180 is formed on the second conductive layer pattern 270. The pixel definition film 180 includes an opening 185 that exposes a portion of the pixel electrode 710. The organic emission layer 720 is formed on the pixel electrode 710, and the common electrode 730 is formed on the organic emission layer 720.

By the above configuration, the organic light emitting diode (OLED) display 102, according to the present embodiment may have a simple structure so that a number of photolithography processes that are used in the manufacturing process is reduced. In detail, the gate insulating layer pattern 240, the first conductive layer pattern 250 and the interlayer insulating layer pattern 260 are formed through a same photolithography process. In addition, the drain electrode 278 of the second thin film transistor 20 and the pixel electrode 710 of the OLED 70 are formed through a same photolithography process.

In addition, in forming the second conductive layer pattern 270, in a case of when the first metal layers 2512, 2532, 2542, and 2592 are damaged or short-circuited, it is possible to prevent an occurrence of a short-circuit and defects by having the doped amorphous silicon layers 2511, 2531, 2541, and 2591 being disposed below the first metal layers 2512, 2532, 2542, and 2592, respectively. In addition, although not required in all aspects of the present invention, the OLED display 102 may have a mirror effect by the first interlayer insulating layer 2601 and the second interlayer insulating layer 2602 having different refractive indexes.

Figure 15:
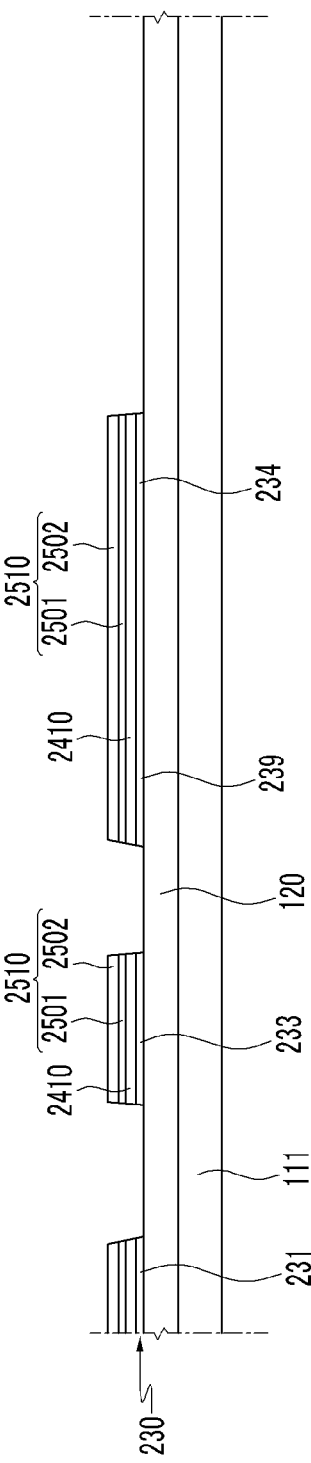
FIG. 15 to FIG. 21 are cross-sectional views and layout views that sequentially illustrate a manufacturing process of the organic light emitting diode (OLED) display that is shown in FIG. 13 and FIG. 14.

Hereinafter, referring to FIG. 15 to FIG. 21, a method of manufacturing an organic light emitting diode (OLED) display 102 according to the embodiment of FIG. 14 will be described. First, as shown in FIG. 15, after a polycrystalline silicon layer, a gate insulating layer, a doped amorphous silicon layer and a first metal layer are sequentially layered on the buffer layer 120, the polycrystalline silicon layer pattern 230, a gate insulating layer intermediate 2410 and a first conductive layer intermediate 2510 are formed by being patterned through a photolithography process. The polycrystalline silicon layer pattern 230 includes the polycrystalline active layers 233 and 234 and the first capacitor electrode 239. The first conductive layer intermediate 2510 includes a doped amorphous silicon layer 2501 and a first metal layer 2502. Although not required in all aspects of the present invention, the polycrystalline silicon layer pattern 230, gate insulating layer intermediate 2410 and the first conductive layer intermediate 2510 are formed through a photolithography process using one photosensitive film pattern.

Figure 16:
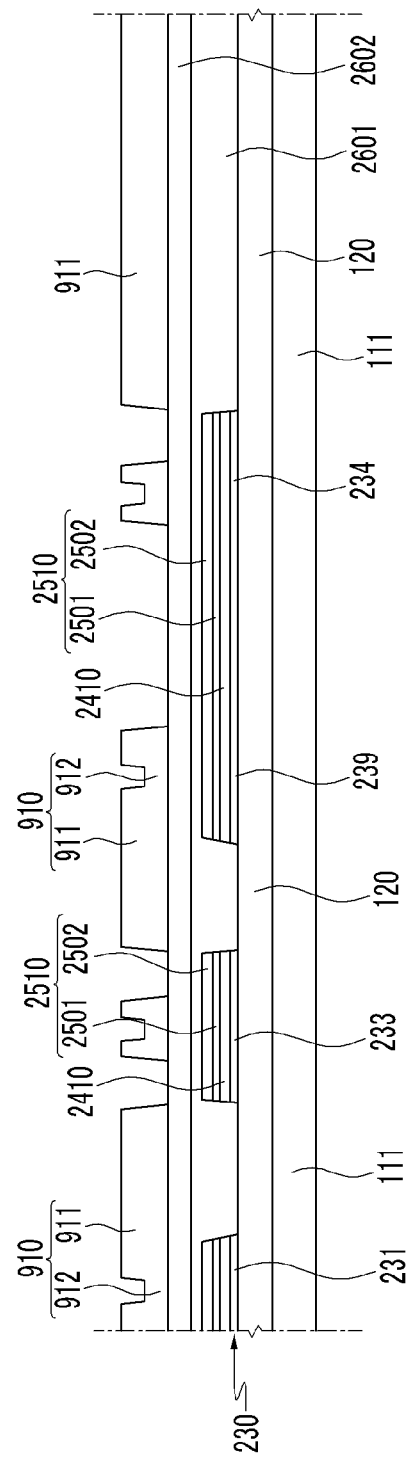

As shown in FIG. 16, a first interlayer insulating layer 2601 and a second interlayer insulating layer 2602 are sequentially formed on the first conductive layer intermediate 2510 and have different refractive indexes. In addition, a first photosensitive film pattern 910 is formed on the second interlayer insulating layer 2602. The first photosensitive pattern 910 is formed through a double exposure or halftone exposure process. The first photosensitive film pattern 910 includes a first high thickness portion 911 and a first low thickness portion 912.

Figure 17:
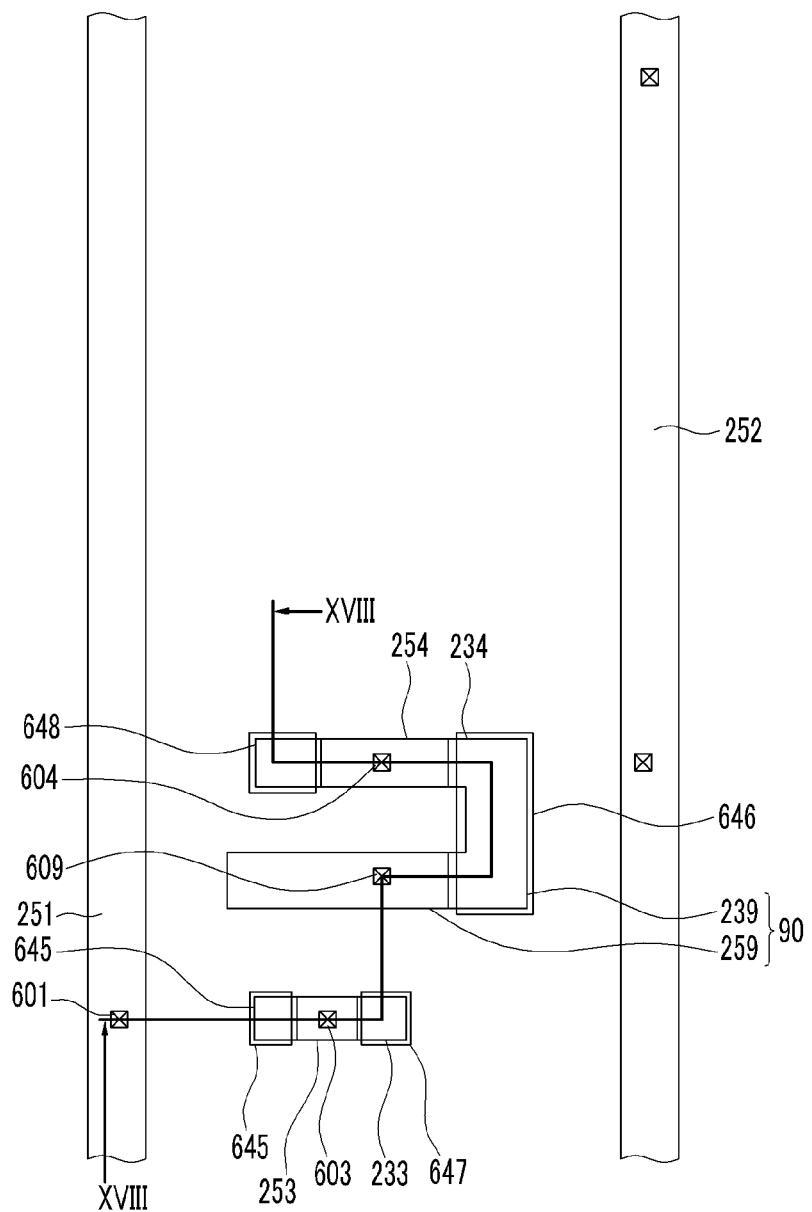
Figure 18:
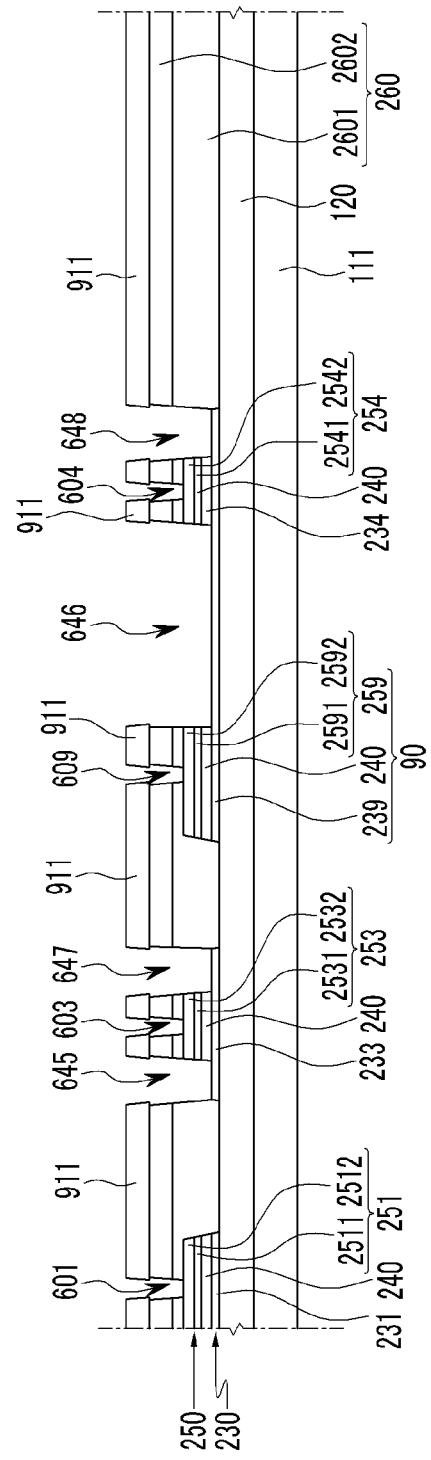

As shown in FIG. 17 and FIG. 18, the gate insulating layer pattern 240, the first conductive layer pattern 250 and interlayer insulating layer pattern 260 are formed by patterning the gate insulating layer intermediate 2410, the first conductive layer intermediate 2510, the first interlayer insulating layer 2601 and the second interlayer insulating layer 2602 through a photolithography process using the first photosensitive film pattern 910.

The gate insulating layer pattern 240 is formed in a same pattern as the first conductive layer pattern 250. The first conductive layer pattern 250 includes the gate electrodes 253 and 254, the second capacitor electrode 259, the data line 251 and the common power line 252 (see FIG. 13). The interlayer insulating layer pattern 260 includes the contact holes 601, 603, 604, and 609 that expose a portion of the gate electrodes 253 and 254, and also expose the second capacitor electrode 259, the data line 251 and the common power line 252. In addition, the interlayer insulating layer pattern 260 has contact holes 645, 646, 647, and 648 that expose a portion of the polycrystalline active layers 233 and 234 and the first capacitor electrode 239 in conjunction with the gate insulating layer pattern 240.

In addition, the polycrystalline silicon layer pattern 230 further includes the dummy polycrystalline layer 231. The dummy polycrystalline layer 231 is disposed under the data line 251 of the first conductive layer pattern 250 and the common power line 252. The dummy polycrystalline layer 231 is also formed in a course of manufacturing the OLED display 102 according to the present embodiment.

An n-type or p-type impurity is doped in the area of the portion of the polycrystalline active layers 233 and 234. In this case, the gate electrodes 253 and 254 prevent the n-type or p-type impurity from being doped in the polycrystalline active layers 233 and 234. Therefore, the polycrystalline active layers 233 and 234 are an intrinsic semiconductor area that is disposed under the gate electrodes 153 and 154 and an impurity semiconductor area that is disposed under the source electrodes 275 and 276 and drain electrodes 277 and 278.

However, aspects of the present invention are not limited thereto, and a process of doping the n-type or p-type impurity in the area of the portion of the polycrystalline active layers 233 and 234 may be performed after the second conductive layer pattern 170 is formed. In this case, in order to allow the source electrodes 275 and 276 and the drain electrodes 277 and 278 to pass through the n-type or p-type impurity, a second metal layer 2702 should be removed and it should be formed of a transparent conductive layer 2701 (see FIG. 19).

Figure 19:
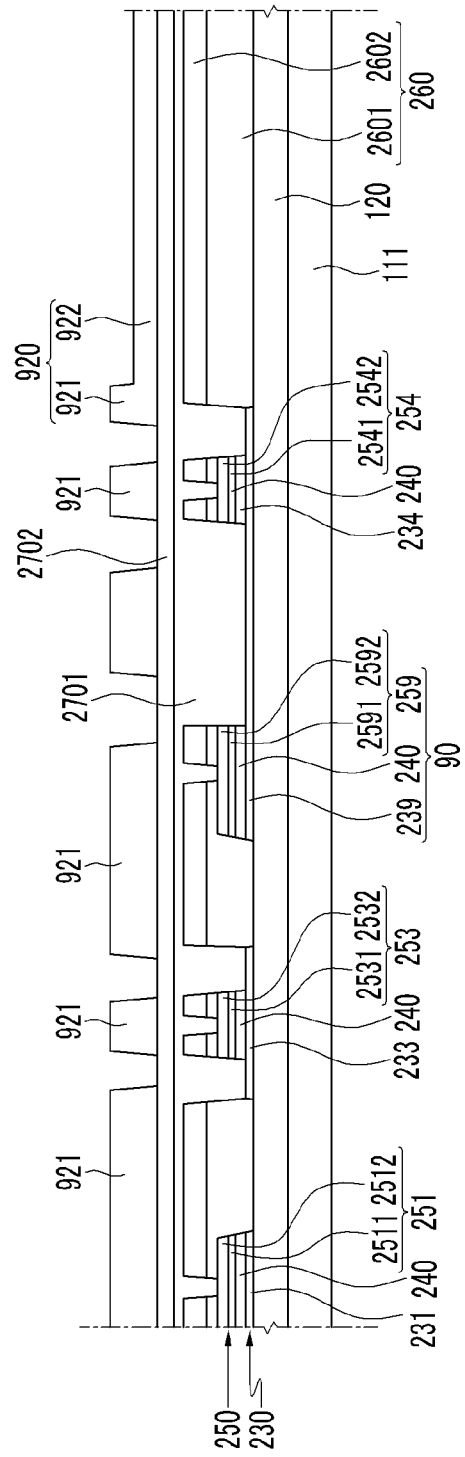

As shown in FIG. 19, the transparent conductive layer 2701 and the second metal layer 2702 are sequentially layered on the interlayer insulating layer pattern 260. The transparent conductive layer 2701 is connected through the contact holes 601, 603, 604, and 609 and the opening regions 645, 646, 647, and 648 of the interlayer insulating layer pattern 260 to the gate electrodes 253 and 254, the first capacitor electrode 239, the second capacitor electrode 259, the data line 251, the common power line 252 and polycrystalline active layers 233 and 234. In addition, a second photosensitive film pattern 920 is formed on the second metal layer 2702. The second photosensitive film pattern 920 includes a second high thickness portion 921 and a second low thickness portion 922. In this case, the second low thickness portion 922 corresponds to a position at which the pixel electrode 710 will be formed.

Figure 20:
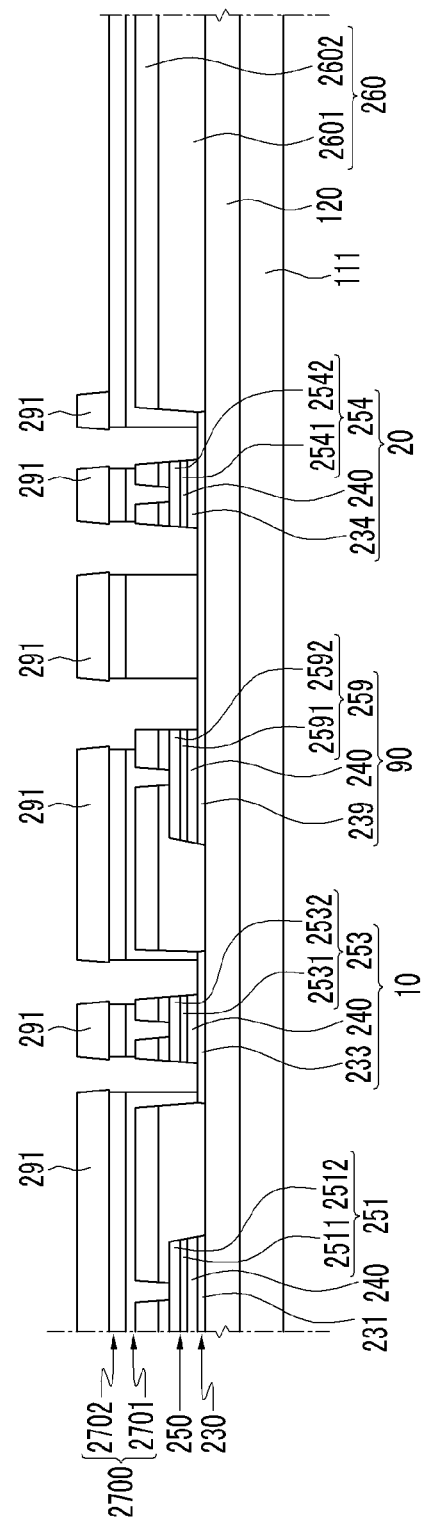
Figure 21:
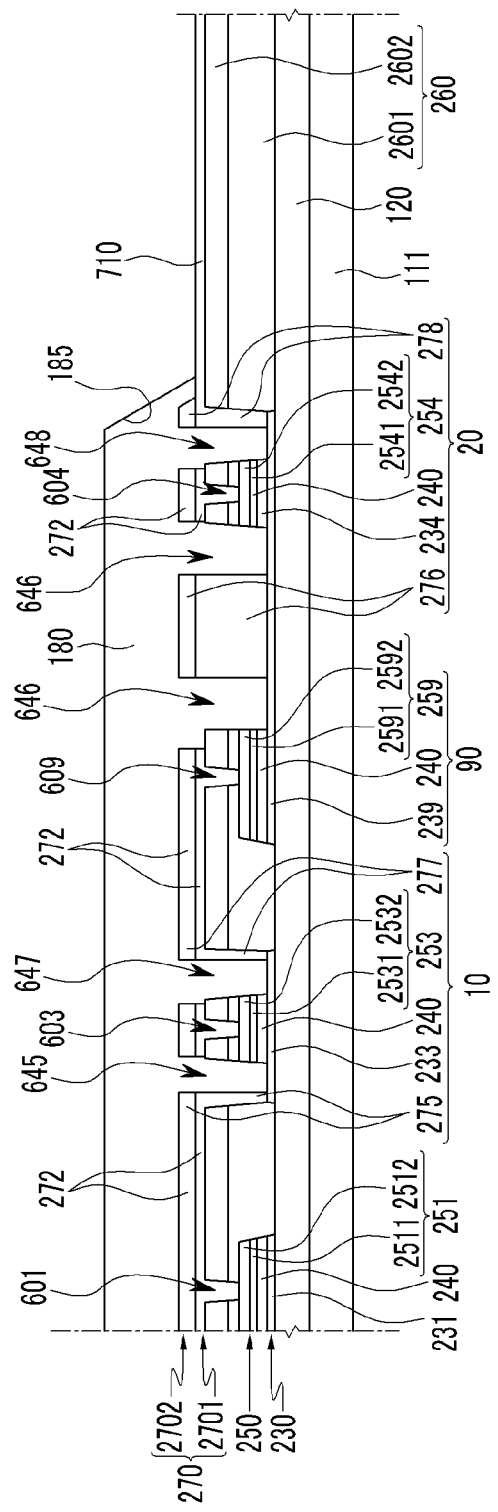

As shown in FIG. 20, by etching through the second photosensitive film pattern 920, a second conductive layer pattern intermediate 2700 is formed of the transparent conductive layer 2701 and the second metal layer 2702. Next, the second low thickness portion 922 of the second photosensitive film pattern 920 is removed, and the second conductive layer pattern intermediate 2700 is etched again through the second high thickness portion 921 to form the second conductive layer pattern 270. The second conductive layer pattern 270, as shown in FIG. 21, forms the source electrodes 275 and 276, drain electrodes 277 and 278, gate line 271 and connection line 272 that are formed of the transparent conductive layer 2701 and the second metal layer 2702. The second conductive layer pattern 270 also forms the pixel electrode 710 that are formed of the transparent conductive layer 2701.

As shown in FIG. 21, the pixel definition film 180 is formed on the second conductive layer pattern 270. The pixel definition film 180 includes an opening 185 that exposes a portion of the pixel electrode 710. In addition, the organic emission layer 720 and common electrode 730 are sequentially layered on the pixel electrode 710. Through the method, the organic light emitting diode (OLED) display 102, according to the embodiment of FIG. 14, may be manufactured. That is, by reducing a number of photolithography processes, the organic light emitting diode (OLED) display 102 may be manufactured. Therefore, according to the embodiment of FIG. 14, an enlarged OLED display 102 may effectively maintain a high productivity with respect to manufacturing yield.

In addition, in the forming of the second conductive layer pattern 270, in the case of when the first metal layers 2512, 2532, 2542, and 2592 is damaged or short-circuited, it is possible to prevent an occurrence of the short-circuit and defects through the doped amorphous silicon layers 2511, 2531, 2541, and 2591. In addition, the OLED display 102 may obtain a mirror effect through the first interlayer insulating layer 2601 and the second interlayer insulating layer 2602 having different refractive indexes.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light emitting diode (OLED) display, comprising:
sequentially layering a polycrystalline silicon layer, a gate insulating layer, and a first metal layer on the substrate main body;
forming a polycrystalline silicon layer pattern, a gate insulating layer pattern, and a first conductive layer pattern, by patterning the polycrystalline silicon layer, the gate insulating layer, and the first metal layer, the polycrystalline silicon layer pattern comprising an active layer and a first capacitor electrode, and the first conductive layer pattern comprising a gate electrode and a second capacitor electrode disposed on the gate insulating pattern;
forming an interlayer insulating layer on the first conductive layer pattern;
patterning the interlayer insulating layer to form an interlayer insulating layer pattern, the patterning comprising forming contact holes that expose the active layer and the first capacitor electrode; and
forming a second conductive layer pattern on the interlayer insulating layer pattern and in the contact holes,
wherein the gate insulating layer pattern is formed in a same pattern as the polycrystalline silicon layer pattern.

2. The method of claim 1, wherein the polycrystalline silicon layer pattern, the gate insulating layer pattern, and the first conductive layer pattern are formed together through a photolithography process using a double exposure or halftone exposure process.

3. The method of claim 1, wherein:
the contact holes expose the second capacitor electrode and the gate electrode; and
the contact holes that expose the active layer extend through the gate insulating layer pattern.

4. The method of claim 1, wherein the second conductive layer pattern comprises a source electrode and a drain electrode that are connected to the active layer through corresponding ones of the contact holes.

5. The method of claim 1, wherein the first conductive layer pattern further comprises:
a data line; and
a common power line.

6. The method of claim 1, wherein the forming of the second conductive layer pattern comprises:
sequentially layering a transparent conductive layer and a second metal layer on the interlayer insulating layer;
forming a source electrode, a drain electrode, and a pixel electrode by patterning the transparent conductive layer and the second metal layer, the source and drain electrodes comprising portions of the transparent conductive layer and the second metal layer, and the pixel electrode comprising a portion of the transparent conductive layer.

7. The method of claim 6, further comprising doping an n-type or p-type impurity into the polycrystalline silicon layer, before forming the second conductive layer pattern.

8. The method of claim 1, wherein the forming of the second conductive layer pattern comprises:
sequentially layering a transparent conductive layer and a second metal layer on the interlayer insulating layer pattern; and
forming a source electrode, a drain electrode, and a pixel electrode that include the transparent conductive layer, by patterning the transparent conductive layer and the second metal layer together.

9. The method of claim 8, further comprising doping an n-type or p-type impurity on an area of a portion of the polycrystalline silicon layer pattern after forming the second conductive layer pattern.

10. The method of claim 8, further comprising:
forming the pixel definition film having an opening exposing a portion of the pixel electrode on the second conductive layer pattern;
forming an organic emission layer on the pixel electrode; and
forming a common electrode on the organic emission layer.

11. The method of claim 10, wherein the second conductive layer pattern comprises:
a gate line; and
a connection line that contacts the gate electrode and the second capacitor electrode through corresponding ones of the contact holes.

12. The method of claim 10, wherein the forming of the interlayer insulating layer comprises:
forming a first interlayer insulating layer on the first conductive layer pattern; and
forming a second interlayer insulating layer on the first interlayer insulating layer,
wherein a refractive index of the second interlayer insulating layer is different than a refractive index of the first interlayer insulating layer.

13. The method of claim 12, wherein the first and second interlayer insulating layers comprise an inorganic film, an organic film, or a combination thereof.

* * * * *